(12) United States Patent
Muranaka et al.

(10) Patent No.: US 7,449,408 B2
(45) Date of Patent: Nov. 11, 2008

(54) METHOD FOR MANUFACTURING SEMICONDUCTOR DEVICE

(75) Inventors: Koji Muranaka, Kanagawa (JP); Ryoji Nomura, Kanagawa (JP); Takeshi Shichi, Kanagawa (JP); Tatsuya Arao, Kanagawa (JP); Masahiro Katayama, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 83 days.

(21) Appl. No.: 10/863,170

(22) Filed: Jun. 8, 2004

(65) Prior Publication Data
US 2005/0164520 A1 Jul. 28, 2005

(30) Foreign Application Priority Data
Jun. 13, 2003 (JP) ............................. 2003-169690

(51) Int. Cl.
*H01L 21/4763* (2006.01)
(52) U.S. Cl. ....................... 438/623; 257/759
(58) Field of Classification Search .................. 438/30, 438/149, 151, 562, 618, 622, 623, 758, 780, 438/781, 795; 257/774, 758, 759; 430/311, 430/322, 327
See application file for complete search history.

(56) References Cited

U.S. PATENT DOCUMENTS

| 5,518,579 | A | * | 5/1996 | Katsuyama et al. | |
|---|---|---|---|---|---|
| 5,955,244 | A | * | 9/1999 | Duval | |
| 6,037,197 | A | * | 3/2000 | Yamazaki et al. | 438/151 |
| 6,127,279 | A | | 10/2000 | Konuma | |
| 6,664,029 | B1 | * | 12/2003 | Imai et al. | 430/313 |
| 6,797,647 | B2 | * | 9/2004 | Shono et al. | |

FOREIGN PATENT DOCUMENTS

| EP | 0 665 470 A2 | * | 8/1995 |
|---|---|---|---|
| EP | 1 271 244 A1 | * | 1/2003 |
| JP | 62-247523 | * | 10/1987 |
| JP | 5-36598 | * | 2/1993 |
| JP | 5-72741 | | 3/1993 |
| JP | 7-249572 | * | 9/1995 |
| JP | 08-078329 | | 3/1996 |
| JP | 2000-003960 | | 1/2000 |
| JP | 2000-516355 | * | 12/2000 |
| JP | 2001-284327 | * | 10/2001 |
| JP | 2002-40668 | * | 2/2002 |
| JP | 2003-7579 | * | 1/2003 |
| WO | WO 98/08143 A1 | * | 2/1998 |

* cited by examiner

*Primary Examiner*—David Vu
(74) *Attorney, Agent, or Firm*—Cook Alex Ltd.

(57) ABSTRACT

It is an object of the present invention to provide a method for manufacturing a semiconductor device in which a desired region can be etched by evenly applying a solution including a resist and a method for manufacturing a semiconductor device having a laminated structure by forming an interlayer insulating layer with an organic resin.

18 Claims, 10 Drawing Sheets

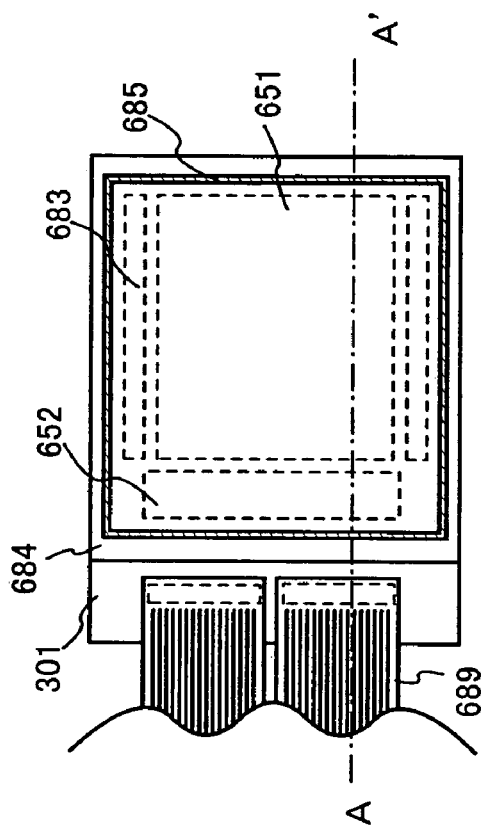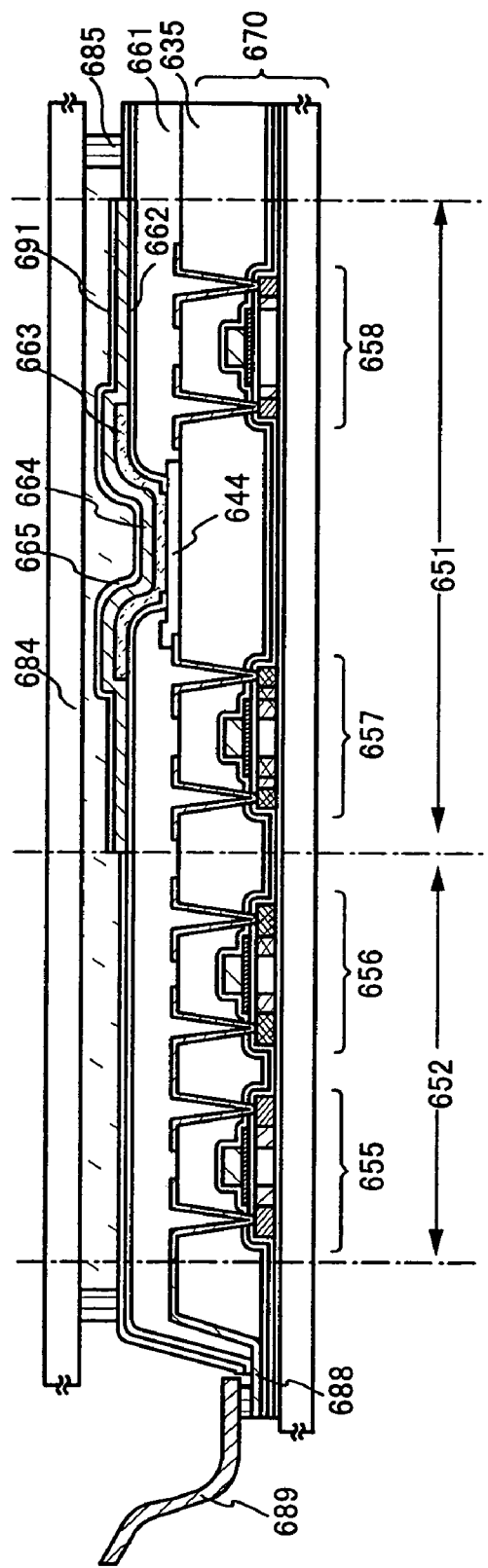
Fig. 6A
Fig. 6B

METHOD FOR MANUFACTURING SEMICONDUCTOR DEVICE

BACKGROUND OF THE INVENTION

1. Field of the Invention

The present invention relates to a method for manufacturing a semiconductor device, particularly to a method for improving wettability of an organic resin.

2. Related Art

With densification of integrated circuits such as IC, LSI, and VLSI, a semiconductor device has been miniaturized so far. In addition, proportion of wirings has also been increased, and wirings come to influence integration density. Therefore, a technique for lamination of wirings is under development. Thus, in a laminated semiconductor device, a layer made of an organic resin is used as an insulating layer (interlayer insulating layer) that is used for insulating each layer (Reference 1: Japanese Patent Laid-Open No. 2000-3960).

Meanwhile, steps of manufacturing a semiconductor device include a step of etching any thin film into a desired shape using a resist pattern as a mask. Specifically, a thin film is formed over a silicon wafer or a semiconductor thin film by CVD (Chemical Vapor Deposition) or sputtering. A resist is applied thereover and is exposed to light, an ultraviolet ray, an electron beam, or the like to have a desired pattern. Thereafter, the resist is developed to form a resist pattern, and the thin film is etched using the resist pattern as a mask.

However, when a solution including a resist is applied onto an interlayer insulating layer 702 made of an organic resin, the solution including a resist cannot evenly be applied onto the entire surface of the interlayer insulating layer, as shown in FIG. 7A. Consequently, there is a problem that film thickness of a resist becomes uneven. In FIGS. 7A and 7B, reference numeral 703a denotes a region of a resist having even film thickness, and reference numeral 703b denotes a region of a resist that has uneven film thickness and that has thicker film thickness than the region 703a having even film thickness.

Accordingly, it is difficult to form a resist pattern having a desired shape in a desired region at the time of etching the interlayer insulating layer made of an organic resin into any shape or at the time of forming a hole (contact hole) for connecting to a semiconductor region. As a result, there is a problem that a desired region cannot be etched and a decrease in a yield is caused.

In addition, there is a problem that it is difficult to form a semiconductor device having a laminated structure since an organic resin cannot be applied to the entire surface of a first interlayer insulating layer at the time of forming a semiconductor device having a laminated structure with an organic resin.

SUMMARY OF THE INVENTION

It is an object of the present invention to provide a method for manufacturing a semiconductor device in which a desired region can be etched by evenly applying a solution including a resist and a method for manufacturing a semiconductor device having a laminated structure by forming an interlayer insulating layer with an organic resin.

The present invention provides a method for manufacturing a semiconductor device, including the steps of: treating a surface of a film made of a first organic resin (hereinafter, also referred to as an organic resin film) with an acid solution or an alkaline solution (hereinafter, referred to as an acid solution or an alkaline solution); and forming a second organic resin film by applying an organic resin or a solution containing an organic resin thereover.

Namely, according to the present invention, a functional group existing in the organic resin film is reacted with an organic compound contained in the acid solution or the alkaline solution to form a substituent having polarity, preferably a substituent having high polarity on a surface of the organic resin film. The functional group having high polarity that is reacted with the acid solution or the alkaline solution and that is formed on the surface of the organic resin film is expressed by any formula in Chemical Formula 3. A hydrogen bond is easily formed between the functional group and a functional group having high polarity shown in Chemical Formula 4.

Therefore, wettability on the surface treated with the acid solution or the alkaline solution with a solvent having high polarity is improved, and a solvent including a functional group having high polarity to be shown later in Chemical Formula 4 and a solution including the functional group as its main component can evenly be applied.

When a second organic resin includes a functional group having high polarity shown in Chemical Formula 4, a hydrogen bond is formed between the second organic resin film and a functional group which is to be shown in Chemical Formula 3 and which is formed on the first organic resin film. The affinity between the first organic resin and the second organic resin is improved; consequently, the second organic resin can evenly be applied onto the first organic resin film.

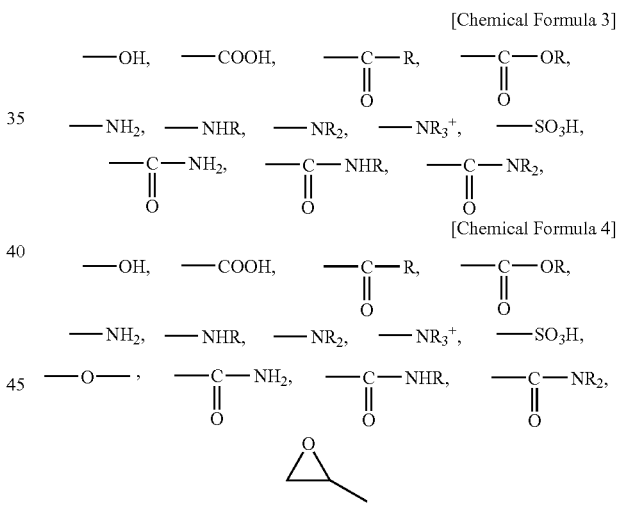

The first organic resin film to which the present invention can be applied is reacted with an acid solution or an alkaline solution, particularly an organic compound contained in the solution, such as an acrylic resin, a melamine resin, a polyester resin, a polycarbonate resin, an epoxy resin, a furan resin, or a diallyl phthalate resin to form such a functional group having high polarity as shown in Chemical Formula 3.

In the present invention, the acid solution includes a substrate that is dissociated in the solution and that provides a hydrogen ion, and phenol, sulfonic acid, carboxylic acid, and a derivative thereof can be given as a typical example of the substrate. In addition, the alkaline solution includes a substrate having a hydroxyl amino group or an amino group, and hydroxylamine, amino alcohol, hydrazine, semicarbazide, and a derivative thereof, ammonia, or the like can be given as a typical example of the substrate.

In the present invention, a functional group which forms a hydrogen bond with a functional group having polarity is shown in Chemical Formula 4. As an organic resin including the functional group, an acrylic resin, a polyimide resin, a melamine resin, a polyester resin, a polycarbonate resin, a phenol resin, an epoxy resin, polyacetal, polyether, polyurethane, polyamide (nylon), a furan resin, a diallyl phthalate resin, or the like is given.

In addition, an interlayer insulating film is given as a typical example of the first organic resin film, and a resist or an interlayer insulating film is given as a typical example of the second organic resin film. An interlayer insulating film having thick film thickness can be formed. A resist can evenly be applied onto an organic resin film. Moreover, a highly integrated semiconductor device can be formed.

In the present invention, the organic resin film or the organic resin layer each means an film or a layer in which an organic resin is cured by irradiating with light or an electron beam, heating, reducing pressure, or the like.

A method for manufacturing a semiconductor device of the present invention according to the above described scope of the present invention can include structures described hereinafter.

According to the present invention, a method for manufacturing a semiconductor device comprises the steps of: treating a surface of a first interlayer insulating film made of a first organic resin with a acid or alkaline solution; and forming a second interlayer insulating film made of a second organic resin on a film made of the first organic resin.

In addition, a method for manufacturing a semiconductor device comprises the steps of: treating a surface of a first film made of a first organic resin with an acid solution or an alkaline solution; forming a second film made of a second organic resin; forming a first film pattern by exposing a part of the second film to light; and forming a second film pattern by etching the first film using the first film pattern as a mask. The second film pattern at the time is an insulating film having an opening.

In addition, a method for manufacturing a semiconductor device comprises the steps of: forming a first film made of a first organic resin on a semiconductor region; treating a surface of the first film with an acid solution or an alkaline solution; forming a second film made of a second organic resin; forming a first film pattern by exposing a part of the second film to light; exposing a part of the semiconductor region by etching the first film using the first film pattern as a mask; forming a first conductive layer connected to the semiconductor region; treating the surface of the first film with an acid solution or an alkaline solution; forming a third film made of the first organic resin; forming a fourth film made of the second organic resin on the third film; forming a second film pattern by exposing a part of the fourth film to light; exposing a part of the first conductive layer by etching the third film using the second film pattern as a mask; and forming a second conductive layer connected to the first conductive layer.

After the second organic resin or a solution containing the second organic resin is applied, it is cured by irradiating with light or an electron beam, heating, or reducing pressure to form the second film.

In addition, a film made of the first organic resin is reacted with an acid solution or an alkaline solution, and forms functional group having high polarity. Here, the functional group having high polarity is one of or a plurality of the above functional groups (Chemical Formula 3).

The first organic resin is an acrylic resin, a melamine resin, a polyester resin, a polycarbonate resin, an epoxy resin, a furan resin, or a diallyl phthalate resin. The acid solution includes phenol, sulfonic acid, carboxylic acid, or a derivative thereof. The alkaline solution includes hydroxylamine, amino alcohol, hydrazine, semicarbazide, a derivative thereof, or ammonia. The second organic resin includes one of or a plurality of the above functional groups (Chemical Formula 4). The second resin is an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallyl phthalate resin.

According to the present invention, the semiconductor device includes a thin film transistor, a field effect transistor, a MOS transistor, a bipolar transistor, an organic transistor, a memory element, a diode, a photoelectric conversion element, a resistor element, a coil, a capacitor element, an inductor, or the like.

BRIEF DESCRIPTION OF THE DRAWINGS

In the accompanying drawings:

FIGS. 6A and 6B show a method for manufacturing a display panel according to the present invention;

DETAILED DESCRIPTION OF THE INVENTION

Hereinafter, embodiments of the present invention are described with reference to the attached drawings. However, the present invention is not limited to the following description. As is easily known to a person skilled in the art, the mode and the detail of the invention can be variously changed without departing from the purpose and the scope of the present invention. Thus, the invention should not be interpreted limiting to the description of the following embodiments. For example, a thin film transistor (TFT) is used for a semiconductor device in this embodiment; however, a semiconductor device is not particularly limited thereto. A semiconductor device such as a field effect transistor (FET), a MOS transistor, a bipolar transistor, an organic transistor, a memory element, a diode, a photoelectric conversion element, a resistor element, a coil, a capacitor element, an inductor, or the like may be similarly used.

Embodiment 1

In this embodiment, a method for improving surface wettability of a film made of an organic resin (hereinafter referred to as an organic resin film) is described with reference to FIGS. 1A to 1C.

Figure 1A:
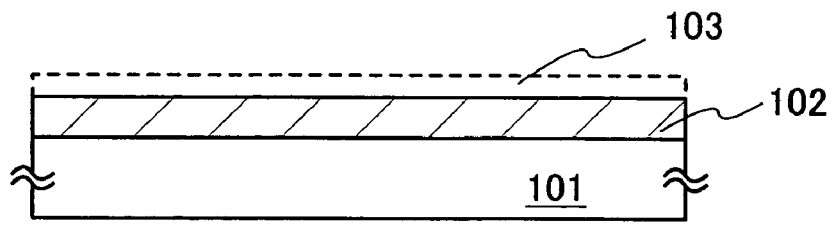
FIGS. 1A to 1C show a method for performing a surface-treatment according to the present invention.
Figure 1B:
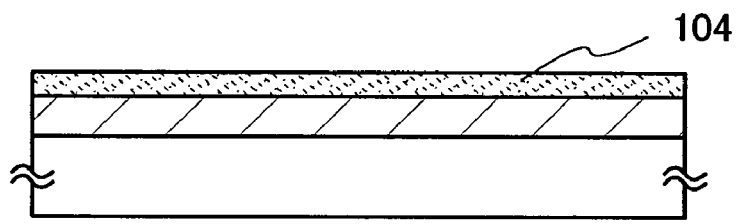
Figure 1C:
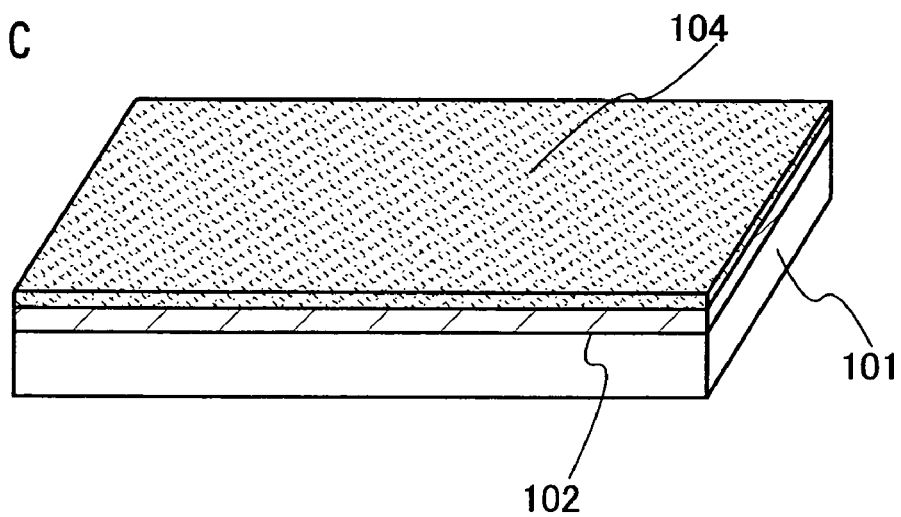

FIGS. 1A and 1B are cross-sectional views of a substrate 101 over which an organic resin film 102 is formed. A surface of the organic resin film is treated with an acid solution or an alkaline solution 103, and a functional group having high polarity is formed on the surface. As the acid solution or the alkaline solution, a solution including phenol, sulfonic acid, carboxylic acid, hydroxylamine, amino alcohol, hydrazine, semicarbazide, an derivative thereof, ammonia, or the like is given. As a method for treating with the solution, there is a spin type treatment method (a solution is applied to a rotating substrate), a batch type (one of or a plurality of substrates is soaked into a solution tank), a single wafer type (a solution is flowed on a substrate with the substrate transported one by one), or the like. Subsequently, the acid solution or the alkaline solution is washed off with a solvent such as alcohol. Then, the substrate may be heated at a temperature of from 150° C. to 250° C. for from 5 minutes to 15 minutes to remove the solvent on the surface of the organic resin film. According to the step, the organic resin film that is swelled by the treatment with the acid solution or the alkaline solution can be returned to an original non-swelling condition.

Subsequently, a solution including a resist 104 is applied to the surface of the organic resin film 102 on which the functional group having high polarity is formed, as shown in FIG. 1B. The resist is dissolved in a solvent having any one of the functional groups in the above Chemical Formula 4 such as ethyl cellosolve acetate, ethyl lactate, or propylene glycol-monomethyl ether acetate. FIG. 1C is a perspective view of FIG. 1B. According to this embodiment, the solution including a resist can evenly be applied by forming a functional group having high polarity expressed by any formula in the above Chemical Formula 3 on the surface of the organic resin film and by improving surface polarity.

Note that an organic resin having a functional group in Chemical Formula 4 such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallyl phthalate resin is preferably used for a base resin of a resist which is a stimulus responsive resin used for lithography. In this case, a resist having evener film thickness can be formed.

In this embodiment, an organic resin having a functional group in Chemical Formula 4 such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallyl phthalate resin may be applied as an interlayer insulating film and a planarizing film in place of the resist which is a stimulus responsive resin used for lithography, and may be cured to form an organic resin film (layer). In this case, a flat organic resin film (layer) having thick and even film thickness can be formed.

Embodiment 2

In this embodiment, steps of forming a resist mask for forming a semiconductor device by a surface-treatment of an organic resin film are described with reference to FIGS. 2A to 2D.

Figure 2A:
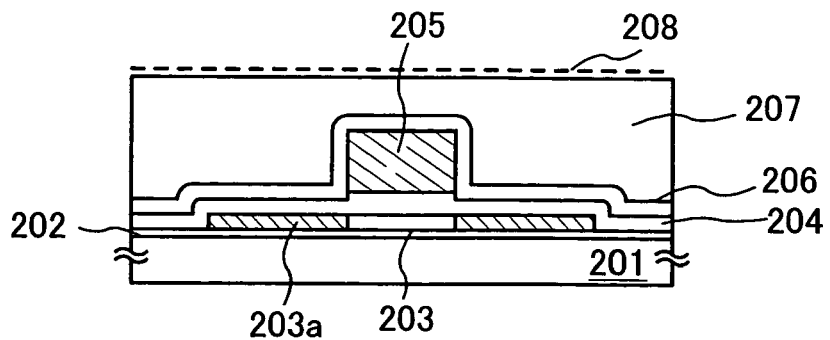
FIGS. 2A to 2D show a method for manufacturing a semiconductor device according to the present invention.

As shown in FIG. 2A, a base film 202 for blocking an impurity from a substrate is formed on a substrate 201 if necessary. After a semiconductor region 203 made of a semiconductor film having a desired shape is formed, a first insulating film 204 serving as a gate insulating film and a first conductive film serving as a gate electrode are formed. Subsequently, a gate electrode 205 is formed by etching the first conductive film into a desired shape. Depending on the etching condition, the first insulating film 204 is also partly etched; consequently, the film thickness becomes thin. Then, a second insulating film 206 made of a silicon oxide film may be formed over the entire surface of the substrate. The second insulating film can prevent the gate electrode from oxidizing. After an impurity region is formed by doping an impurity into the semiconductor region 203 using the gate electrode as a mask, the impurity region is heat-treated, irradiated with intense light, or irradiated with a laser beam to activate the impurity doped into the impurity region. According to these steps, a source region and a drain region 203a are formed. Thereafter, a solution including an organic resin having a functional group in the above Chemical Formula 4 is applied onto the entire surface of the substrate and is cured, thereby forming an interlayer insulating layer (organic resin film) 207. The resins described in Embodiment 1 can be used as the organic resin.

Subsequently, a surface of the interlayer insulating layer (organic resin film) is treated with an acid solution or an alkaline solution 208, and a functional group having high polarity shown in the above Chemical Formula 3 is formed on the surface. As for a kind of acid solutions or alkaline solutions and a treatment method thereof, those described in Embodiment 1 can be applied. Then, the acid solution or the alkaline solution is washed off with a solvent such as alcohol.

As the substrate 201, a glass substrate such as an alumino borosilicate glass, a barium borosilicate glass, or an aluminosilicate glass, a quartz substrate, a sapphire substrate, or the like is used. In addition, a semiconductive or conductive substrate such as a plastic substrate, a silicon substrate on which an insulating film is formed, a compound semiconductor substrate, a stainless substrate can be applied.

The semiconductor film is formed by a known method such as low pressure thermal CVD, plasma CVD, or sputtering. A semiconductor material, for example, silicon, or an amorphous or crystalline alloy containing silicon as its main component can be used for the semiconductor film.

The gate electrode is made of: an element selected from tantalum (Ta), tungsten (W), titanium (Ti), molybdenum (Mo), aluminum (Al), copper (Cu), chromium (Cr), and neodymium (Nd); an alloy material or an compound material including these elements as its main component. A silver-copper-palladium alloy (AgPdCu alloy) may also be used. In addition, a structure of the gate electrode may be either a single layer structure or a laminated structure.

Figure 2B:
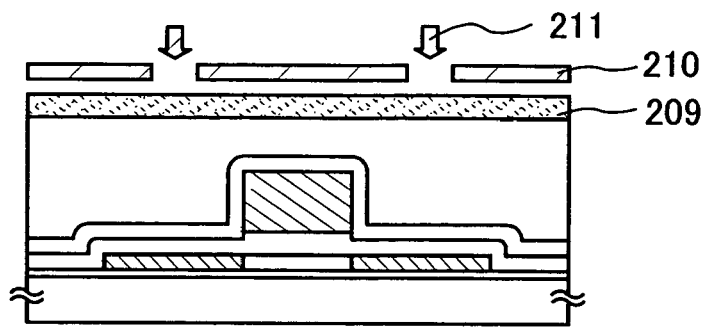

Subsequently, a solution including a resist 209 is applied to a surface of the interlayer insulating layer (organic resin film) on which the functional group having high polarity is formed as shown in FIG. 2B. Thereafter, the solution including a resist 209 is exposed to light by irradiating a desired region with light, an ultraviolet ray, an electron beam, or the like 211 using a photomask 210 for forming a pattern.

Figure 2C:
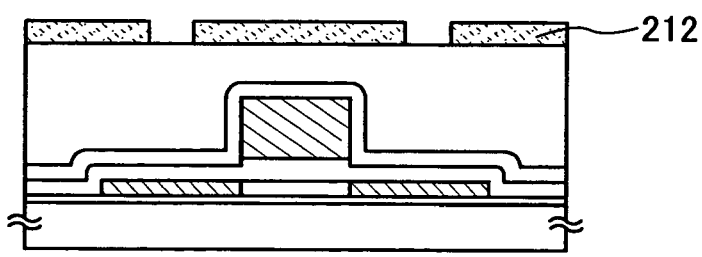

A resist mask 212 covering a desired region is formed by developing the resist, as shown in FIG. 2C.

Figure 2D:
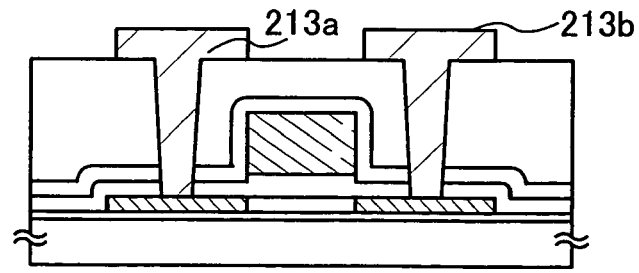

The interlayer insulating layer (organic resin film) 207 and the second insulating film 206 are etched by a known method to expose a part of the source region and the drain region, as shown in FIG. 2D. After the resist mask is removed, a source electrode 213a and a drain electrode and 213b connected to the source region and the drain region are formed.

According to this embodiment, surface polarity can be improved by forming a functional group having high polarity on a surface of an interlayer insulating layer (organic resin film). A solvent of a resist or a resist generally includes a functional group having high polarity shown in Chemical Formula 4; accordingly, a solution including a resist can evenly be applied. Namely, since a resist mask having a uniform shape and even film thickness can be formed in a desired region, the desired region can be etched into a desired shape.

Embodiment 3

Figure 3:
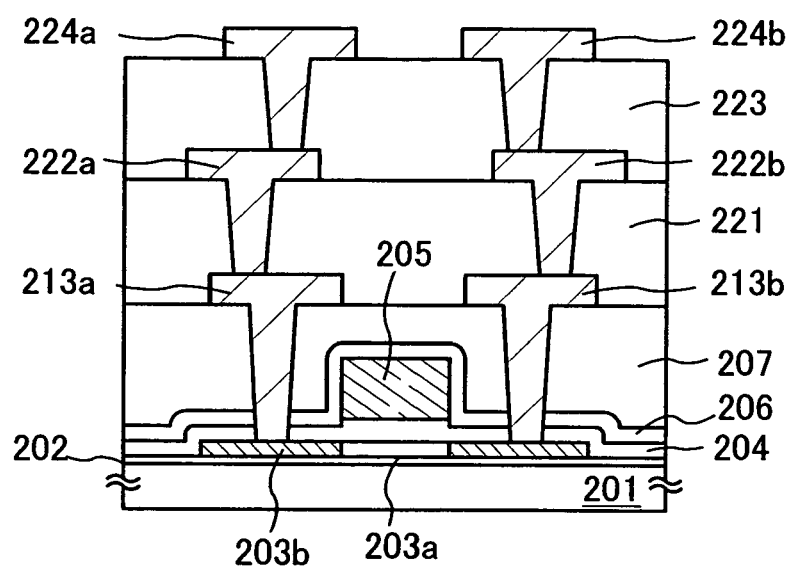
FIG. 3 shows a method for manufacturing a semiconductor device according to the present invention.

In this embodiment, a method for manufacturing a semiconductor device having a laminated structure with a multilayered wiring is described with reference to FIG. 3.

A surface of the TFT manufactured by the steps in Embodiment 2, that is, surfaces of the interlayer insulating layer 207 and the source electrode 213a and the drain electrode and 213b is treated with the acid solution or the alkaline solution described in Embodiment 1, and a functional group having high polarity is formed on a surface of the interlayer insulating layer 207.

Subsequently, after the acid solution or the alkaline solution over the substrate surface is removed by washing, an organic resin is applied to the substrate surface and is cured to form a second interlayer insulating layer 221. After a functional group having high polarity is formed on the surface of the second interlayer insulating layer 221 by the method described in Embodiment 2, a resist mask is formed by applying a solution including a resist having the functional group shown in Chemical Formula 4 and by exposing the resist to light and developing the resist. The second interlayer insulating layer 221 is etched with the use of the resist mask to expose a part of a surface of the source electrode or the drain electrode 213a or 213b. The resist mask is removed by ashing or with a removing solution. A conductive film is formed over the entire surface of the substrate and is etched into a desired shape to form first wirings 222a and 222b connected to the source electrode 213a and the drain electrode 213b.

After the second interlayer insulating layer is treated with the acid solution or the alkaline solution according to similar steps, a third interlayer insulating layer 223 and second wirings 224a and 224b are formed; thus, a multi-layered wiring can be formed.

Note that the multi-layered wiring can be formed by a damascene method, an ink-jetting method, or the like as well as the method (for forming a conductive film and etching a part thereof) employed in this embodiment.

According to this embodiment, surface polarity can be improved by forming a functional group having polarity on a surface of an organic resin film; therefore, a solution including a resist or an organic resin can evenly be applied. Since an even resist mask can be formed in a desired region, the desired region can be etched into a desired shape, and in addition, a semiconductor device having a laminated structure with the use of an organic resin can be manufactured.

EXAMPLE

Example 1

In this example, chemical reaction on a surface of an organic resin at the time of treating an organic resin film applied onto a substrate with an alkaline solution is described.

At first, a step of manufacturing a sample to be measured is described. An organic resin was applied onto a potassium bromide (KBr) substrate. In this example, a thermosetting acrylic resin (a composition ratio thereof is as follows: from 20% to 30% of an acrylic resin; from 1% to 10% of a coupling agent; from 1% to 10% of an epoxy resin; and from 60% to 70% of methoxy propyl acetate) was used as an organic resin. The resin was heated at a temperature of 250° C. for one hour, and was cured. Subsequently, after a substrate was soaked in an alkaline solution (a composition ratio thereof is as follows: 30% of aminoethanol and 70% of glycol ether) at a temperature of 80° C. for six minutes, the substrate was washed with isopropyl alcohol, subsequently with ethanol, and was dried at a room temperature under reduced pressure for three hours. Then, the organic resin film was observed by an infrared spectroscopic analysis.

Figure 8:
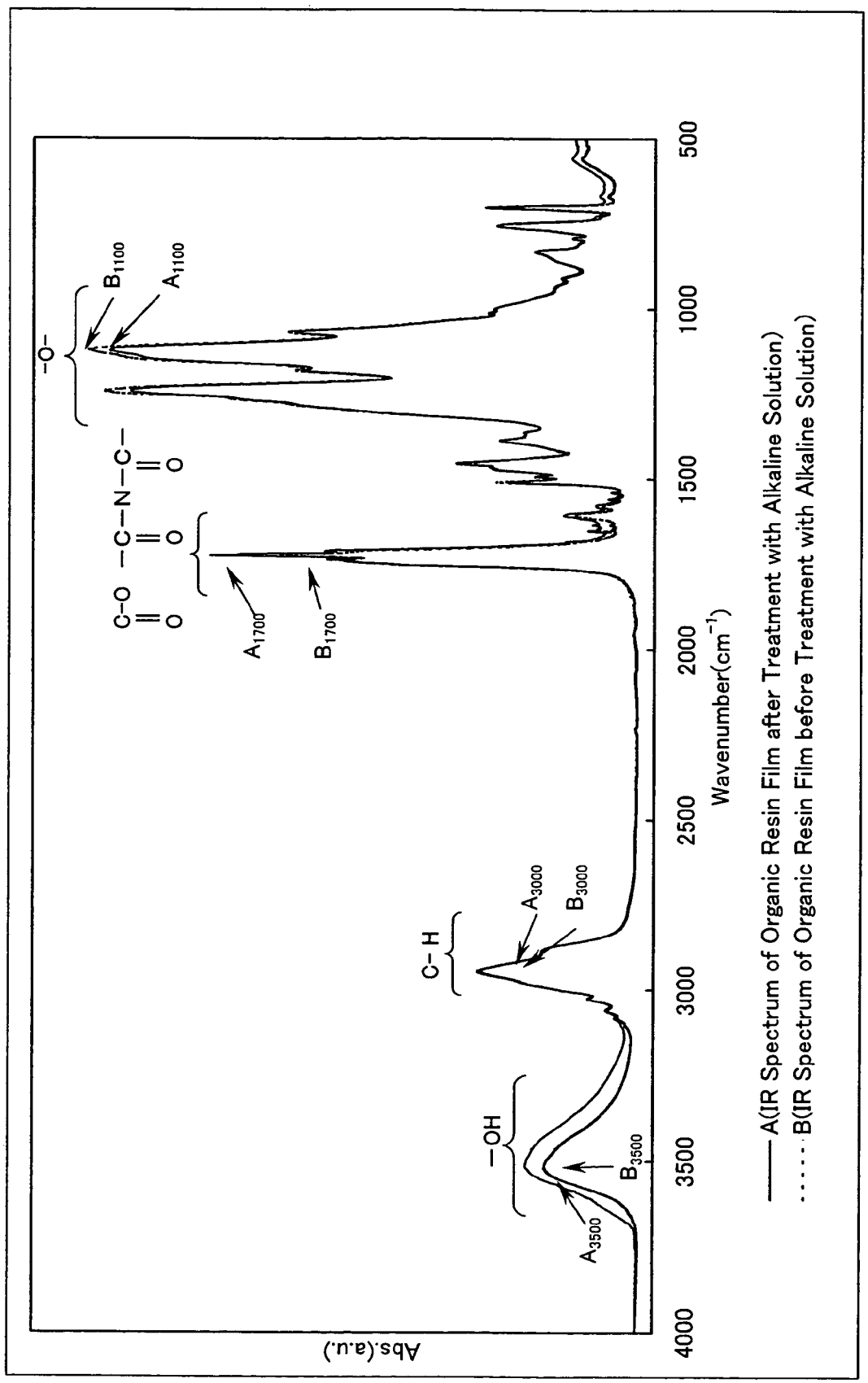
FIG. 8 shows a measurement result of infrared spectroscopy of a surface-treated organic resin according to the present invention.

FIG. 8 shows an infrared absorption spectrum of the organic resin film before and after the treatment with the alkaline solution. A broken line indicates an infrared absorption spectrum of the organic resin film before the treatment, and a continuous line indicates an infrared absorption spectrum of the organic resin film after the treatment with the alkaline solution. As for peaks at 3500 cm$^{-1}$, 3000 cm$^{-1}$, from 1700 cm$^{-1}$ to 1800 cm$^{-1}$, from 1100 cm$^{-1}$ to 1200 cm$^{-1}$, and from 750 cm$^{-1}$ to 950 cm$^{-1}$, each peak after the treatment with the alkaline solution is denoted by $A_{3500}$, $A_{3000}$, $A_{1700}$, and $A_{1100}$, and each peak before the treatment with the alkaline solution is denoted by $B_{3500}$, $B_{3000}$, $B_{1700}$, and $B_{1100}$, respectively.

In the organic resin film after the treatment with the alkaline solution, peak intensity at approximately 3500 cm$^{-1}$ and from 1700 cm$^{-1}$ to 1800 cm$^{-1}$ is increased ($A_{3500}>B_{3500}$, $A_{1700}>B_{1700}$), and peak intensity at approximately from 1100 cm$^{-1}$ to 1200 cm$^{-1}$ is decreased ($B_{1100}>A_{1100}$). The peak of approximately 3500 cm$^{-1}$ expresses absorption of a hydroxyl group (—OH); the peak of approximately from 1700 cm$^{-1}$ to 1800 cm$^{-1}$ expresses absorption which an ester group (—COO—) and an imide group (—CO—N—CO—) overlapped; the peak of approximately from 1100 cm$^{-1}$ to 1200 cm$^{-1}$ expresses absorption of an ether bond (—O—); and the peak approximately 3000 cm$^{-1}$ expresses absorption of a —CH bond.

According to decrease in a peak at approximately from 1100 cm$^{-1}$ to 1200 cm$^{-1}$ and increase in a peak at approximately from 1700 cm$^{-1}$ to 1800 cm$^{-1}$, Formula 1 is thought of as one of the reaction. Namely, an ester group (—COO—) and aminoethanol ($NH_2C_2H_4OH$) are reacted, thereby forming amide. Further, dehydrocondensation proceeds within a molecule, and an imide ring and a hydroxyl group are formed.

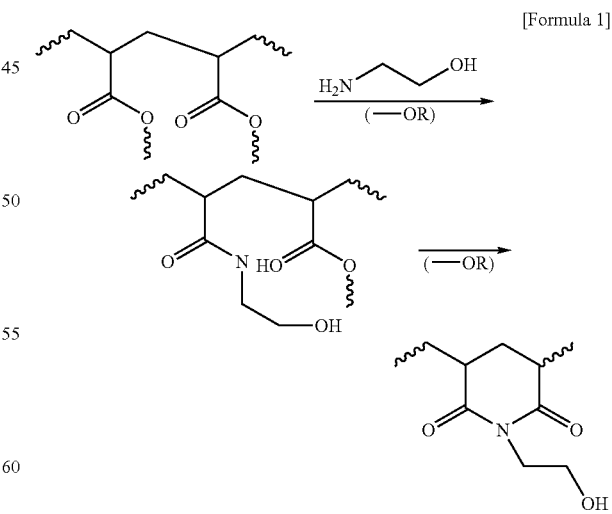

[Formula 1]

An imide group and a hydroxyl group are substituents that can form a hydrogen bond and have high polarity. Therefore, polarity on the surface of the organic resin film is improved, and a hydrogen-bonding substituent is increased; consequently, it can be said that wettability on the surface of the organic resin film with the solvent having high polarity or the organic resin is improved.

Example 2

In this example, treating time and a contact angle at the time of treating a surface of an organic resin film with an alkaline solution are described with reference to FIG. 9.

An organic resin including an acrylic resin (a composition ratio thereof is as follows: from 20% to 30% of an acrylic resin; from 1% to 10% of a coupling agent; from 1% to 10% of an epoxy resin; and from 60% to 70% of methoxy propyl acetate) is applied onto a glass substrate (AN 100 manufactured by Asahi Glass Co., Ltd.), and is heated at a temperature of 250° C. for one hour. The resin is cured to form an organic resin film. Then, the substrate is soaked in a solution including an alkaline solution (a composition rate thereof is as follows: 30% of aminoethanol and 70% of glycol ether) at a temperature of 80° C. for 1, 3, 6, 12, and 24 minutes, respectively. Thereafter, a surface of the substrate is washed with isopropyl alcohol, subsequently with ethanol, and is dehydrated by heating at a temperature of 250° C. for 10 minutes. FIG. 9 shows measured contact angles on each surface of the organic resin films.

Figure 9:
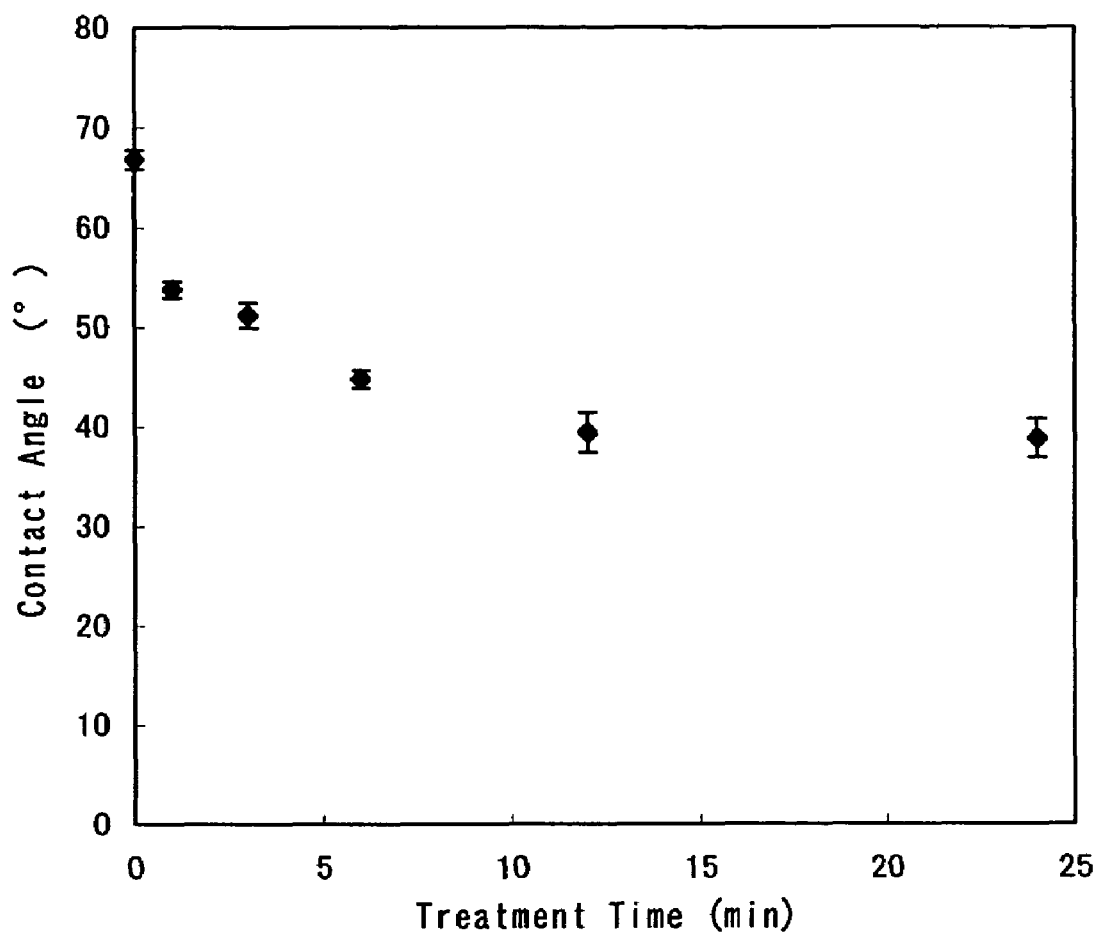
FIG. 9 shows a measurement result of an contact angle of a surface-treated organic resin according to the present invention.
Figure 10A:
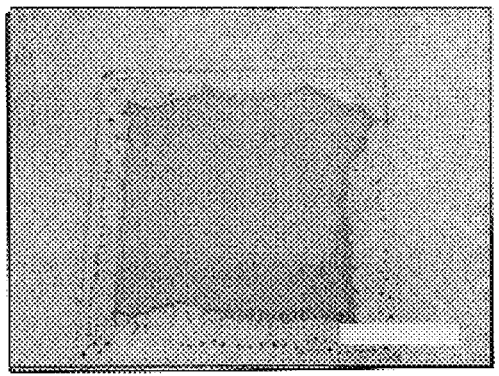
FIGS. 10A to 10F show a surface-treated organic resin to which a resist is applied.
Figure 10B:
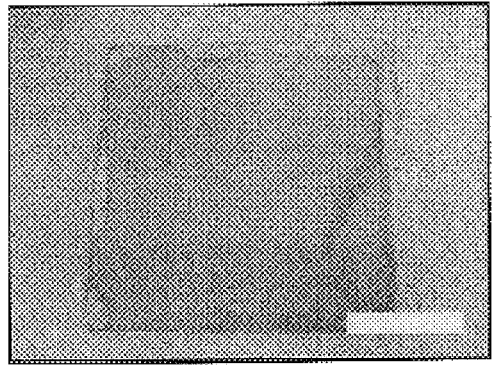
Figure 10C:
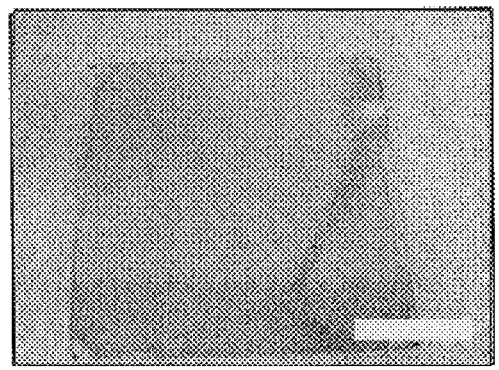
Figure 10D:
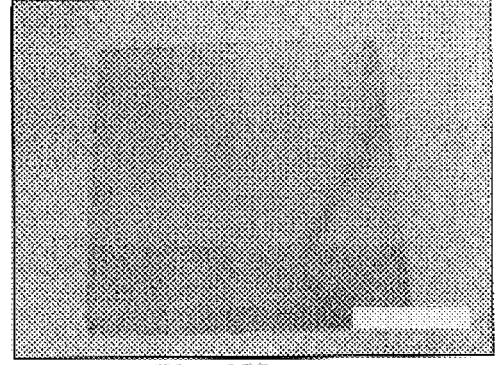
Figure 10E:
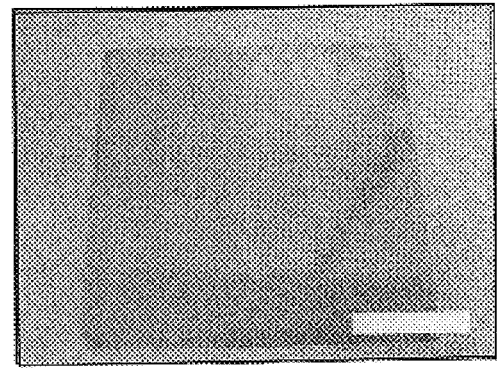
Figure 10F:
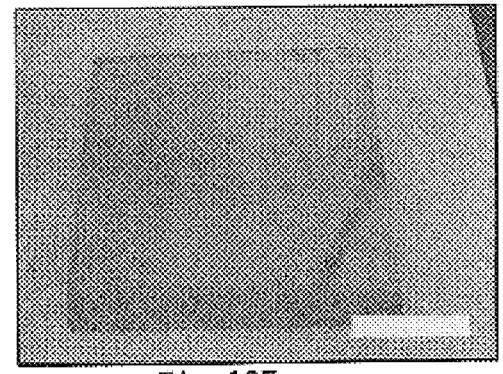

FIG. 9 shows that the longer the time for treating the substrate with the alkaline solution (treating time) is, the smaller the contact angle of the organic resin is, and the contact angle hardly changes when the treating time is 12 minutes or longer.

FIG. 10 shows a state of a resist (a composition ratio thereof is as follows: from 45% to 95% of ethyl cellosolve acetate; from 5% to 40% of a novolac resin; and from 1% to 15% of a photosensitive agent) at the time of being applied to be 1.5 μm onto each surface of the organic resins after the treatment with the alkaline solution. FIG. 10A shows an organic resin film without the treatment with the alkaline solution; FIG. 10B, one treated for 1 minutes; FIG. 10C, one treated for 3 minutes; FIG. 10D, one treated for 6 minutes; FIG. 10E, one treated for 12 minutes; and FIG. 10F, one treated for 24 minutes, which are all photographed from the above. In a sample treated for 6 minutes in FIG. 10D, that is, one having a contact angle of less than 50°, it can be found that wettability with a solution having high polarity, that is, a solvent or a base resin is improved on the surface of the organic resin film, and an organic resin such as a resist can evenly be applied.

Example 3

In this example, a method for manufacturing an active matrix substrate and a display panel therewith according to the present invention is described with reference to FIGS. 4A to 4C, FIG. 5, and FIGS. 6A and 6B. As described in Embodiments 1 to 3, a resist is applied and a laminated structure of an interlayer insulating layer is formed, after a functional group having polarity is formed on a surface of an organic resin film.

Figure 4A:
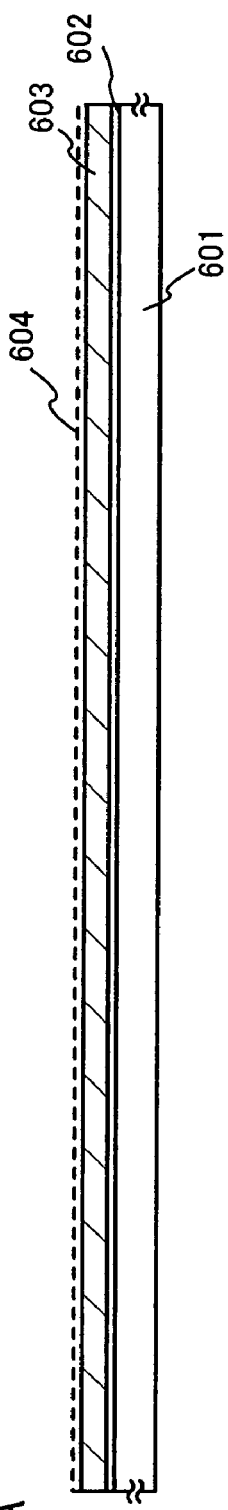
FIGS. 4A to 4C show a method for manufacturing an active matrix substrate according to the present invention.

As shown in FIG. 4A, a base insulating film 602 is formed on a glass substrate (a first substrate 601). In this example, the base insulating film has a two-layer structure, and a first silicon oxynitride film formed by using $SiH_4$, $NH_3$, and $N_2O$ as a reactive gas to be from 50 nm to 100 nm in thickness and a second silicon oxynitride film formed by using $SiH_4$ and $N_2O$ as a reactive gas to be from 100 nm to 150 nm in thickness are laminated.

Subsequently, an amorphous silicon film 603 (film thickness: 54 nm) is laminated on the base insulating film by a known method such as plasma CVD, low pressure CVD, or sputtering.

The amorphous silicon film 603 is crystallized by a known technique according to Japanese Patent Laid-Open No. 8-78329. According to the technique disclosed in the Patent Gazette, a metal element for promoting crystallization is selectively doped into the amorphous silicon film and is heat-treated, thereby forming a semiconductor film having a crystal structure Spreading from the doped region as a starting point. Here, after heat treatment (at a temperature of 450° C., for one hour) for dehydrogenation, heat treatment (at a temperature of from 550° C. to 650° C., for from 4 to 24 hours) for crystallization is performed.

Subsequently, the metal element is gettered from a crystalline silicon film, and the metal element in the crystalline silicon film is removed or reduced in concentration. The gettering may be performed by either of the following methods. One is a method in which a gettering site is formed by doping phosphorus, a rare gas (typically, argon), or the like into a part of the crystalline silicon film and is heat-treated thereafter, so that a metal element is segregated. The other is a method in which an amorphous silicon film or a crystalline silicon film each containing phosphorus, a rare gas, or the like is laminated over the crystalline silicon film with an oxide film therebetween to form a gettering site, so that a metal element is moved to the gettering site after heat treatment. It is preferable that the metal impurity concentration in the crystalline silicon film after gettering is $1 \times 10^{17}/cm^3$ or less (SIMS (secondary ion mass spectrometry) measurement limit or less), and more preferably, $5 \times 10^{16}/cm^3$ or less when measured by ICP-MS (inductively coupled plasma mass spectrometry).

Figure 4B:
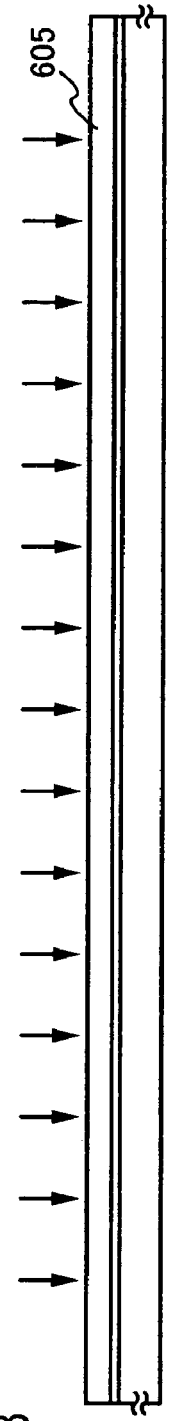

Next, a crystalline silicon film 605 is preferably irradiated with a laser beam for eliminating defects left in crystal grains and increasing the degree of crystallinity (proportion of a crystalline component to a total volume of a film) (FIG. 4B).

Next, a TFT is formed using the crystalline silicon film by employing a known technique. A figure thereof is FIG. 4C. The crystalline silicon film is etched into a desired shape and thus, active regions 611 to 614 are formed. Next, a first insulating film 615 containing silicon as its main component, which functions as a gate insulating film is formed after washing a surface of the silicon film with an etchant including fluorinated acid.

Subsequently, gate electrodes 616 to 619 are formed after washing a surface of the gate insulating film. In this example, the gate electrodes have a laminated structure and include a first conductive film 616a in contact with the first insulating film and a second conductive film 616b in contact with the first conductive film. The first conductive film is made of a tantalum nitride film, and the second conductive film is made of a tungsten film. However, a material for the gate electrode may not be limited thereto, and may alternatively be an element selected from those described in Embodiment 2, an alloy material or a compound material each containing any of the elements as its main component. Further, the gate electrode has a laminated structure in this example; however, the gate electrode is not limited thereto, and either a single layer structure or a multi-layer structure having three or more layers may be employed.

Next, an impurity element (P, As, or the like) that imparts n-type conductivity to a semiconductor and an impurity element (B, or the like) that imparts p-type conductivity thereto, phosphorus and boron here, are appropriately doped, and source regions and drain regions 620 to 627 and LDD regions (lightly doped drain regions) 628 to 631 of an n-channel TFT and a p-channel TFT are formed. A part of each LDD region 628 to 630 is covered with each gate electrode; however, the LDD region 631 is not covered with the gate electrode. Note that, as for steps for forming a gate electrode and an LDD region, the steps disclosed in Japanese Patent Laid-Open No. 2001-345453 may be adopted.

Figure 4C:
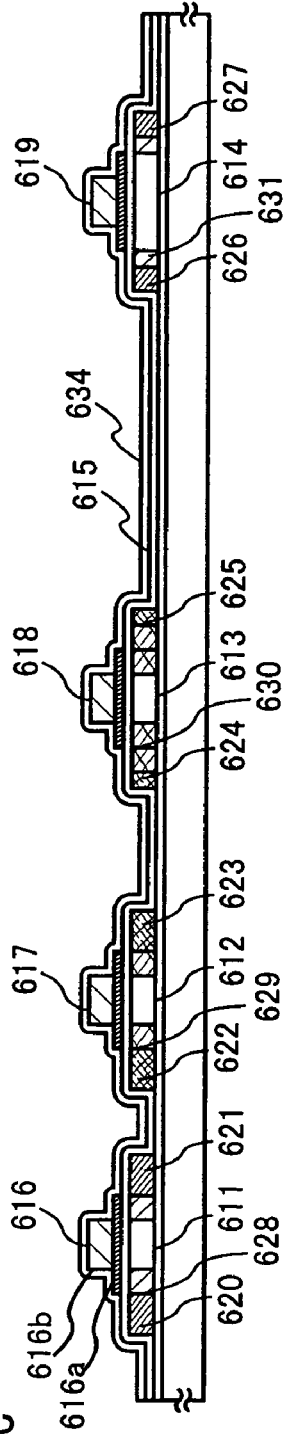

Next, after a second insulating film 634 is formed over the gate electrode and the gate insulating film as shown in FIG. 4C, heat treatment, or irradiation of intense light or a laser beam is performed to activate the doped impurity element. Simultaneously with activation, this process can recover the plasma damage to a gate insulation film, and the plasma damage to the interface of a gate insulation film and a semiconductor film.

Subsequently, a first interlayer insulating film 635 is formed on the second insulating film 634 as shown in FIG. 5A. An inorganic insulating film or an organic material resin can be used for the first interlayer insulating film. When an organic resin is used, a photosensitive resin or a non-photosensitive resin can be used. When a photosensitive organic resin is used, a first opening having a curvature can be formed by exposing to light by photolithography and by etching the photosensitive organic resin thereafter. It is advantageous to form such an opening having a curvature, because coverage of an electrode to be formed later can be improved. In addition, the first opening can be formed by development and exposure to light without forming a resist mask. A resist mask does not need to be removed by ashing or with a removing solution; consequently, steps can be reduced. A non-photosensitive acrylic resin film having a thickness of 1.05 μm is formed over the first interlayer insulating film in this example.

Then, an alkaline solution is applied onto the surface of the first interlayer insulating film 635, and a functional group having polarity is formed on the surface of the first interlayer insulating film. According to this step, a resist to be applied later can evenly be applied. In this example, a solution including aminoethanol at a temperature of 80° C. is used as the alkaline solution, and the substrate is soaked therein for six minutes. The alkaline solution is washed off with isopropyl alcohol or ethanol, and then, the substrate is dried. Thereafter, a resist is applied onto the first interlayer insulating film. In this example, a resist (a composition ration thereof is as follows: from 45% to 95% of ethyl cellosolve acetate; from 5% to 40% of a novolac resin; and from 1% to 15% of a photosensitive agent) is used. Thereafter, a desired region is exposed to light and developed to form a contact hole, and then, a resist mask is formed.

Subsequently, the first interlayer insulating film 635, the second insulating film 634, and the gate insulating film 615 are sequentially etched to form the first opening. The resist mask is removed by ashing or with a removing solution. Then, a third insulating film (not shown) made of a nitride insulating film (typically, a silicon nitride film or a silicon nitride oxide film) is formed to cover the first opening and the first interlayer insulating film 635, and thereafter, may partly be etched to form an opening.

Subsequently, a metal film is formed on the first opening and exposed to light by photolithography, and is etched, thereby forming source electrodes and drain electrodes 637 to 643. A film made of an element selected from aluminum (Al), titanium (Ti), molybdenum (Mo), tungsten (W), and silicon (Si); or an alloy film thereof is used for the metal film. In this example, after a titanium film/an aluminum-silicon alloy film/a titanium film (Ti/Al—Si/Ti) are laminated to have thickness of 100 nm/350 nm/100 nm respectively, patterning and etching are performed to have a desired shape; thus, the source electrodes and the drain electrodes 637 to 643 are formed. In addition, the source electrodes and the drain electrodes can be formed by discharging a metal solution on the first opening region with the use of ink-jetting. In this case, steps of forming and removing the resist mask can be reduced. Thereafter, a first pixel electrode 644 is formed.

As described above, n-channel TFTs 655 and 658, and p-channel TFTs 656 and 657 can be manufactured.

Further, an n-channel TFT 655 and a p-channel TFT 656 are used for a driver circuit 650 as a CMOS circuit, and the p-channel TFT 657 and the n-channel TFT 658 are used for a pixel area 651; thus, an active matrix substrate 670 on which both a driver circuit and a pixel area are formed can be obtained.

Next, steps for forming a light emitting element over the active matrix substrate thereby forming a display device are described.

FIG. 6A is a top view of the display panel. FIG. 6B is a cross-sectional view taken along the line A-A' in FIG. 6A. Reference numeral 651 indicated by a dotted line denotes a pixel area; 652, a source signal line driver circuit; 683, a gate signal line driver circuit; 684, a counter substrate; and 685, a sealant containing a gap material for maintaining a gap between a pair of substrates. An inner space that is surrounded by the sealant 685 is filled with an encapsulant. An external input terminal 689 such as an FPC (Flexible printed circuit), a TAB (Tape Automated Bonding) tape, or a TCP (Tape Carrier Package) is provided. A video signal or a clock signal inputted to the source signal line driver circuit 652 and the gate signal line driver circuit 683 is transmitted through a connection wiring (a region 688 in FIG. 6B). Only an FPC is illustrated here; however, a printed wiring board (PWB) may be attached to the FPC.

FIG. 6B is a cross-sectional view of the display panel. A light emitting element is formed in the pixel area 651 of the active matrix substrate 670. The source line driver circuit 652 is shown as a driver circuit in FIG. 5; a CMOS circuit in which the n-channel TFT 655 and the p-channel TFT 656 are combined is formed. The active matrix substrate 670 and the counter substrate 684 are sealed by using the sealant 685 and an encapsulant 691.

A TFT that constitutes the driver circuit can be formed by a PMOS circuit or an NMOS circuit. A driver integrated circuit in which a driver circuit is formed over a substrate is described in this example, but not exclusively, an external driver circuit such as an IC chip may be formed outside a substrate. In addition, a structure of a TFT is not particularly limited, and can be a top gate TFT or a bottom gate TFT.

The pixel area 651 is formed of a plurality of pixels, each of which includes the driver TFT 657, the switching TFT 658, and a first electrode (anode) 637 electrically connected to a drain of the switching TFT 658. Either an n-channel TFT or a p-channel TFT may be used for the driver TFT 657; however, a p-channel TFT is preferably used in the case of being connected to the anode. Further, a storage capacitor (not shown) is preferably provided appropriately. Note that shown here is a cross-sectional view of only one of numerous pixels and an example of providing two TFTs in the pixel; however, three or more TFTs may be provided as well.

A method for manufacturing a display panel is described hereinafter.

Figure 5:
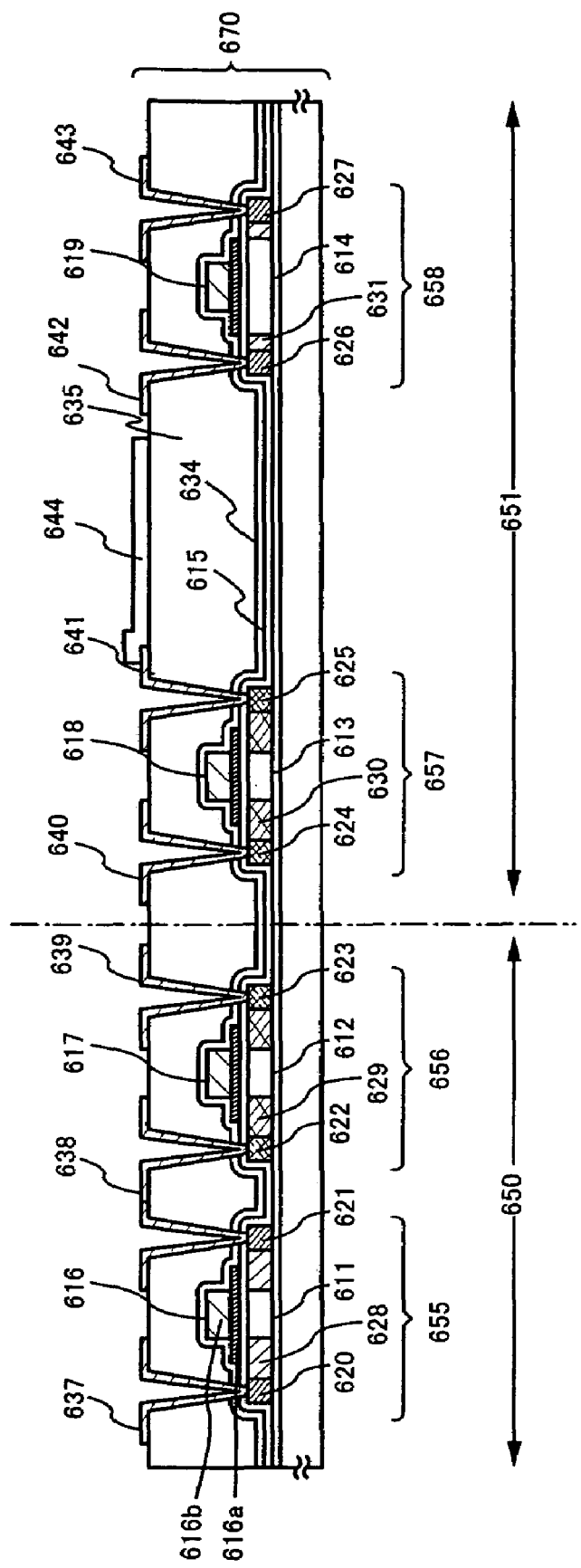
FIG. 5 shows a method for manufacturing an active matrix substrate according to the present invention.
Figure 7A:
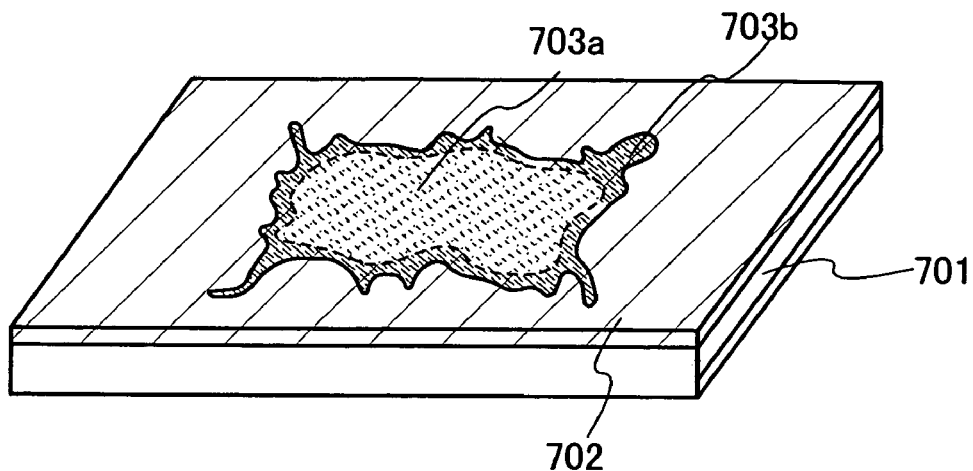
FIGS. 7A and 7B show a conventional example.
Figure 7B:
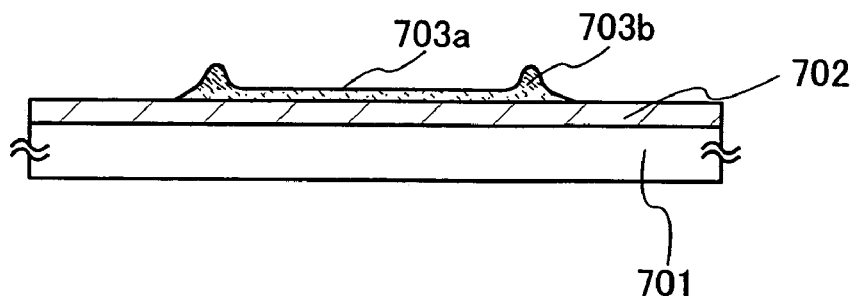

As shown in FIG. 6B, the surface of the active matrix substrate 670, that is, the surface of the first interlayer insulating film 635 is treated with an alkaline solution, and a functional group having polarity is formed. Thereafter, the solution is washed off. In this example, a solution including aminoethanol at a temperature of 80° C. is used as the alkaline solution, and the substrate is soaked therein for six minutes. After the alkaline solution is washed off with isopropyl alcohol or ethanol, the substrate is dried. Subsequently, a photosensitive acrylic resin is applied onto the surface of the active matrix substrate to form a second interlayer insulating film 661. Since a functional group having polarity is formed on the surface of the active matrix substrate, an organic resin can evenly be applied thereto. Thereafter, a second opening is formed. Note that the p-channel TFT 657 of the pixel area in FIG. 5 is used as a driver TFT of a pixel, and the n-channel TFT 658 is used as a switching TFT of a pixel. Further, an inorganic insulating film or an organic insulating film can be used for the second interlayer insulating film 661. In this example, a photosensitive acrylic resin film is used for the second interlayer insulating film; patterning and wet etching are performed; therefore, the second opening having a gently curved inner wall is formed.

After a third insulating film 662 is formed over the second interlayer insulating film, a third opening is formed, and the first pixel electrode 644 is exposed. In this example, a silicon nitride film is formed as the third insulating film.

When an organic material resin is used for the second interlayer insulating film 661, the silicon nitride film of the third insulating film has an effect of blocking a gas generated in the organic material resin and moisture generated in the whole substrate. Therefore, by forming the third insulating film, deterioration of the light emitting element can be prevented. Further, the silicon nitride film has another effect of blocking movement of a metal ion (typically, an alkali metal ion such as a lithium ion ($Li^+$), a sodium ion ($Na^+$), or a potassium ion ($K^+$)) of a material for the electrode to be formed later on the surface of the third insulating film. The silicon nitride film formed in this step has a low hydrogen content, so that the hydrogen is not desorbed from the silicon nitride film by application of voltage or by heat. Therefore, effects of blocking moisture or a metal ion are further enhanced, compared with the one formed by a conventional plasma CVD.

Next, a layer containing a light emitting material 663, a second pixel electrode 664 functioning as a cathode, and a passivation film 665 are provided over the first pixel electrode 644 and the third insulating film 662. A part where the first pixel electrode 644, the layer containing a light emitting material 663, and the second pixel electrode 664 are overlapped is to be an element (light emitting element) that substantially emits light.

A structure of the layer containing a light emitting material 663 can employ a well-known structure. A light emitting layer, a hole injection layer, an electron injection layer, a hole transport layer, and an electron transport layer are included in the layer containing a light emitting material 663 that is disposed between the first pixel electrode 644 and the second pixel electrode 664. In that case, the form in which these layers are laminated or the form in which a part or all of materials forming these layers are mixed can be employed. A light emitting element generally has a structure in which an anode/a light emitting layer/a cathode are sequentially laminated. In addition to the structure, another structure in which an anode/a hole injection layer/a light emitting layer/an electron transport layer/a cathode; an anode/a hole injection layer/a hole transport layer/a light emitting layer/an electron transport layer/an electron injection layer/a cathode; an anode/a hole injection layer/a hole transport layer/a light emitting layer/a hole blocking layer/an electron transport layer/a cathode; or an anode/a hole injection layer/a hole transport layer/a light emitting layer/a hole blocking layer/an electron transport layer/an electron injection layer/a cathode are sequentially laminated may be employed.

As a material for an anode, a conductive material having a large work function is preferably used. In the case of extracting light through an anode, a transparent conductive material such as indium-tin oxide (ITO), indium-zinc oxide (IZO), or the like may be used for the anode. In the case of forming an anode to have a light blocking effect, a single-layer film such as TiN, ZrN, Ti, W, Ni, Pt, Cr, Al, or the like; a laminated film of a titanium nitride film and a film containing aluminum as its main component; a three layered film of a titanium nitride film, a film containing aluminum as its main component, and a titanium nitride film can be used for the anode. Alternatively, an anode can be formed by stacking the above described transparent conductive material over the film having a light blocking effect.

As a material for a cathode, a conductive material having a small work function is preferably used. As a specific example of the cathode material, a rare earth metal such as Yb, Er, or the like can be used to form the cathode, in addition to an alkaline metal such as Li, Cs, or the like, an alkaline earth metal such as Mg, Ca, Sr, or the like, and an alloy including these metals (Mg:Ag, Al:Li, or the like). In addition, in the case of using an electron injection layer such as LiF, CsF, $CaF_2$, $Li_2O$, or the like, a conventional conductive thin film such as aluminum can be used. In the case of extracting light through a cathode, a laminated structure of an ultra thin film including an alkaline metal such as Li, Cs, or the like and an alkaline earth metal such as Mg, Ca, Sr, or the like and a transparent conductive film (ITO, IZO, ZnO, or the like) may be employed. Alternatively, an electron injection layer in which an alkaline metal or an alkaline earth metal, and an electron transport material are co-evaporated is formed, and a transparent conductive film (ITO, IZO, ZnO, or the like) may be laminated thereon.

As a material for forming a layer containing a light emitting material, a known organic compound of low molecular weight, high molecular weight, or medium molecular weight typified by an oligomer or a dendrimer can be used. A light-emitting material (a fluorescent material, a singlet compound) which emits light (fluorescence) by singlet excitation or a light emitting material (a phosphorescent material, a triplet compound) which emits light (phosphorescence) by triplet excitation can be used.

A specific example of a material for forming a layer containing a light emitting material is described hereinafter.

As a hole injection material for forming a hole injection layer, a porphyrin compound is useful among other organic compounds, and phthalocyanine (hereinafter, referred to as $H_2$-Pc), copper phthalocyanine (hereinafter, referred to as Cu-Pc), or the like can be used. Further, a chemically doped high molecular weight conductive compound can be used, such as polyethylene dioxythiophene (hereinafter, referred to as PEDOT) doped with polystyrene sulfonate (hereinafter, referred to as PSS), polyaniline, polyvinyl carbazole (hereinafter referred to as PVK), or the like.

As a hole transport material for forming a hole transport layer, an aromatic amine (that is, the one having a benzene ring-nitrogen bond) compound is preferably used. For example, N,N'-bis(3-methylphenyl)-N,N'-diphenyl-1,1'-biphenyl-4,4'-diamine (abbreviated to TPD) or a derivative thereof such as 4,4'-bis[N-(1-naphthyl)-N-phenyl-amino]-biphenyl (abbreviated to α-NPD) is widely used. Also used is a star burst aromatic amine compound, including: 4,4',4"-tris (N,N-diphenyl-amino)-triphenyl amine (abbreviated to TDATA); 4,4',4"-tris[N-(3-methylphenyl)-N-phenyl-amino]-triphenyl amine (abbreviate to MTDATA); or the like.

As a light emitting material for forming a light emitting layer, various fluorescent pigments are useful, in addition to a metal complex such as tris(8-quinolinolate) aluminum (hereinafter, referred to as $Alq_3$), tris(4-methyl-8-quinolinolate) aluminum (hereinafter referred to as $Almq_3$), bis(10-hydroxybenzo[h]-quinolinato) beryllium (hereinafter referred to as $BeBq_2$), bis(2-methyl-8-quinolinolate)-(4-hydroxy-biphenylyl)-aluminum (hereinafter, referred to as BAlq), bis[2-(2-hydroxyphenyl)-benzooxazolate]zinc (hereinafter, referred to as $Zn(BOX)_2$), or bis[2-(2-hydroxyphenyl)-benzothiazolate]zinc (hereinafter, referred to as $Zn(BTZ)_2$). In addition, a triplet light emitting material, mainly a complex having platinum or iridium as a central metal, can be used. As a triplet light emitting material, tris(2-phenylpyridine)iridium (hereinafter, referred to as $Ir(ppy)_3$), 2,3,7,8,12,13,17,18-octaethyl-21H,23H-porphyrin-platinum (hereinafter, referred to as PtOEP), or the like is known.

As an electron transport material for forming an electron transport layer, a metal complex such as tris(8-quinolinolate) aluminum (abbreviated to $Alq_3$), tris(4-methyl-8-quinolinolate) aluminum (abbreviated to $Almq_3$), bis(10-hydroxybenzo[h]-quinolinato) beryllium (abbreviated to $BeBq_2$), bis(2-methyl-8-quinolinolate)-(4-hydroxy-biphenylyl)-aluminum (abbreviated to BAlq), bis[2-(2-hydroxyphenyl)-benzooxazolate]zinc (abbreviated to $Zn(BOX)_2$), or bis[2-(2-hydroxyphenyl)-benzothiazolate]zinc (abbreviated to $Zn(BTZ)_2$) is given. Further, an oxadiazole derivative such as 2-(4-biphenyl)-5-(4-tert-butylphenyl)-1,3,4-oxadiazole (abbreviated to PBD), or 1,3-bis[5-(p-tert-butylphenyl)-1,3,4-oxadiazole-2-yl]benzene (abbreviated to OXD-7); a triazole derivative such as 3-(4-tert-butylphenyl)-4-phenyl-5-(4-biphenylyl)-1,2,4-triazole (abbreviated to TAZ) or 3-(4-tert-butylphenyl)-4-(4-ethylphenyl)-5-(4-biphenylyl)-1,2,4-triazole (abbreviated to p-EtTAZ); an imidazol derivative such as 2,2',2"-(1,3,5-benzenetryil)tris[1-phenyl-1H-benzimidazole] (abbreviated to TPBI); or a phenanthroline derivative such as bathophenanthroline (abbreviated to BPhen) or bathocuproin (abbreviated to BCP) can be used in addition to a metal complex.

As an electron injection material which can be used for an electron injection layer, the above described electron transport material can be used. In addition, an alkaline metal complex such as lithium acetylacetonate (abbreviated to Li(acac)), 8-quinolinolato-lithium (abbreviated to Liq), or the like can also be used.

In addition to an inorganic compound selected from diamond-like carbon (DLC), Si, Ge, and CN, or an oxide or a nitride thereof, the above compound doped with P, B, N, or the like may be used for an electron injection layer, an electron transport layer, a hole injection layer, or a hole transport layer. Further, an ultra thin film of an insulator such as oxide, nitride, or fluoride of an alkali metal or an alkali earth metal such as LiF, CsF, $CaF_2$, or $Li_2O$ can be used. Furthermore, a compound or an alloy of the metal with Zn, Sn, V, Ru, Sm, or In may be used.

Further, a mixed junction structure of the respective layers above may be used.

The above described structures and materials may appropriately be selected and used for the light emitting element described in this example. In the case of a light emitting device for full color display, material layers emitting light of red, green, and blue can respectively be deposited on the layer containing a light emitting material with the use of an evaporation mask. Instead of applying the method, the material layer may selectively be formed by appropriately applying spin coating, ink-jetting, or the like. Besides, full color display may be performed by making the layer containing a light emitting material emit white light and by separately providing a color filter. Alternatively, full color display may be performed by making the layer containing a light emitting material emit blue light and by separately providing a color conversion layer or the like.

As a passivation film 665, a silicon nitride film, an aluminum nitride film, a thin film containing carbon as its main component (a DLC film, a CN film, or the like), or another insulating film having a high blocking property against moisture and oxygen can be used. In addition, the above films may be laminated.

Next, in order to seal a light emitting element, the counter substrate 684 is pasted to the substrate with the sealant 685 and the encapsulant 691 under an inert gas atmosphere. It is preferable to use an epoxy resin with high viscosity including filler as the sealing material 685. The encapsulant 691 is preferably made of an epoxy resin having low viscosity as well as high transparency. It is also desirable that the sealant 685 and the encapsulant 691 highly blocks moisture and oxygen.

In this example, the steps of manufacturing a display panel having a light emitting element in a pixel portion are described; however, the present invention is not limited thereto. A liquid crystal display, a field emission display element, or the like can be used for the light emitting element in a pixel portion.

Besides, a display panel described in this example can be used as a display of various electronic appliances. The electronic appliance is defined as a product having a display panel. Such electronic appliances are as follows: a video camera; a still camera; a projector, a projection TV, a head mount display, a car navigation system, a personal computer (including a laptop computer), a personal digital assistant (a mobile computer, a cellular phone, or the like).

A semiconductor device having high integration density can be manufactured, since a laminated semiconductor device having an interlayer insulating layer made of an organic resin can be manufactured according to this example.

According to the present invention, wettability with a solution having high polarity, that is, a solvent or a solute on a surface of a film made of an organic resin can be improved. Therefore, a solution having high polarity including a resist or an organic resin can be applied onto a surface of an organic resin film. Consequently, a resist mask having a uniform shape and even film thickness can be formed in a desired region, and the desired region can be etched, thereby enabling to improve a yield. Further, a semiconductor device having high integration density can be manufactured, since a laminated semiconductor device having a plurality of interlayer insulating layers can be manufactured.

What is claimed is:

1. A method for manufacturing a semiconductor device comprising the steps of:
    forming a first interlayer insulating film comprising a first organic resin;
    etching the first interlayer insulating film comprising a first organic resin;
    treating a surface of the first interlayer insulating film comprising a first organic resin with an acid solution or an alkaline solution after the step of etching the first interlayer insulating film; and
    forming a second interlayer insulating film comprising a second organic resin on and in contact with the first interlayer insulating film after the step of treating the surface of the first interlayer insulating film comprising the first organic resin with the acid solution or the alkaline solution.

2. A method according to claim 1, wherein the second interlayer insulating film is formed by:
applying the second organic resin or a solution comprising the second organic resin on and in contact with the first interlayer insulating film; and
curing the second organic resin by irradiating the second organic resin or the solution comprising the second organic resin with a light or an electron beam, heating, or reducing pressure.

3. A method according to claim 1, wherein the first interlayer insulating film is reacted with the acid solution or the alkaline solution to form one or a plurality of functional groups expressed by Chemical Formula 1

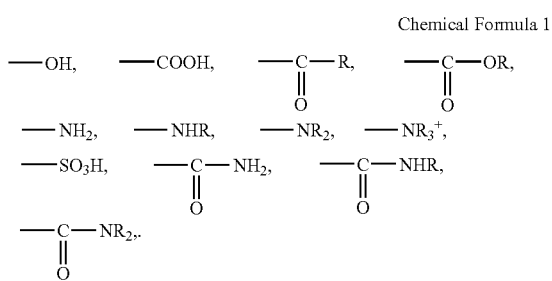

4. A method according to claim 1, wherein the first organic resin is selected from the group consisting of an acrylic resin, a melamine resin, a polyester resin, a polycarbonate resin, an epoxy resin, a furan resin and a diallyl phthalate resin.

5. A method according to claim 1, wherein the acid solution is selected from the group consisting of phenol, sulfonic acid, arboxylic acid and a derivative thereof.

6. A method according to claim 1, wherein the alkaline solution is selected from the group consisting of hydroxylamine, amino alcohol, hydrazine, semicarbazide, a derivative thereof and ammonia.

7. A method according to claim 1, wherein the second organic resin includes one of or a plurality of functional groups expressed by Chemical Formula 2

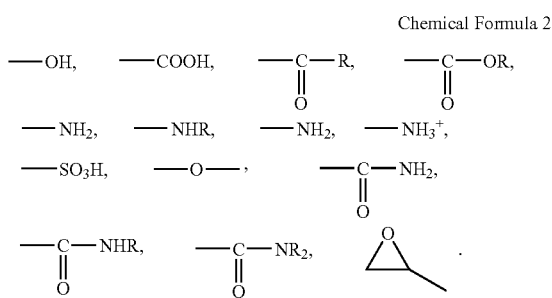

8. A method according to claim 1, wherein the second organic resin is selected from the group consisting of an acrylic resin, a polyimide resin, a melamine resin, a polyester resin, a polycarbonate resin, a phenol resin, an epoxy resin, polyacetal, polyether, polyurethane, polyamide (nylon), a furan resin and a diallyl phthalate resin.

9. A method according to claim 1, wherein the semiconductor device is selected from the group consisting of a thin film transistor, a field effect transistor, a MOS transistor, a bipolar transistor, an organic transistor, a memory element, a diode, a photoelectric conversion element, a resistor element, a coil, a capacitor element and an inductor.

10. A method for manufacturing a semiconductor device comprising the steps of:
forming a semiconductor film over a substrate;
forming a gate insulating film over the semiconductor film;
forming a gate electrode over the gate insulating film;
forming a first film comprising a first organic resin over the gate electrode;
etching the first film comprising a first organic resin;
treating a surface of the first film with an acid solution or an alkaline solution after the step of etching the first film; and
forming a second film comprising a second organic resin on and in contact with the surface of the first film after the step of treating the surface of the first film comprising the first organic resin with the acid solution or the alkaline solution.

11. A method according to claim 10, wherein the second film is formed by:
applying the second organic resin or a solution comprising the second organic resin on and in contact with the first film; and
curing the second organic resin by irradiating the second organic resin or the solution comprising the second organic resin with a light or an electron beam, heating, or reducing pressure.

12. A method according to claim 10, wherein the first film is reacted with the acid solution or the alkaline solution to form one or a plurality of functional groups expressed by Chemical Formula 1

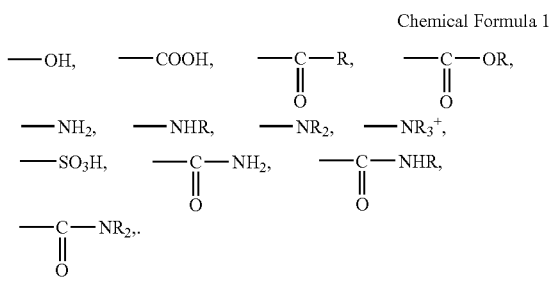

13. A method according to claim 10, wherein the first organic resin is selected from the group consisting of an acrylic resin, a melamine resin, a polyester resin, a polycarbonate resin, an epoxy resin, a bran resin and a diallyl phthalate resin.

14. A method according to claim 10, wherein the acid solution is selected from the group consisting of phenol, sulfonic acid, arboxylic acid and a derivative thereof.

15. A method according to claim 10, wherein the alkaline solution is selected from the group consisting of hydroxylamine, amino alcohol, hydrazine, semicarbazide, a derivative thereof and ammonia.

16. A method according to claim 10, wherein the second organic resin includes one of or a plurality of functional groups expressed by Chemical Formula 2

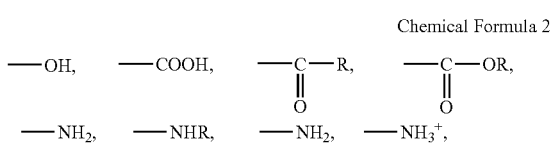

-continued

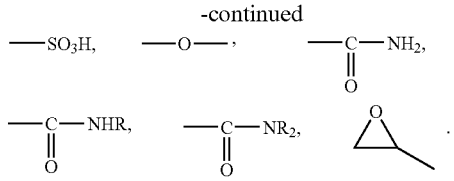

17. A method according to claim 10, wherein the second organic resin is selected from the group consisting of an acrylic resin, a polyimide resin, a melamine resin, a polyester resin, a polycarbonate resin, a phenol resin, an epoxy resin, polyacetal, polyether, polyurethane, polyamide (nylon), a furan resin and a diallyl phthalate resin.

18. A method according to claim 10, wherein the semiconductor device is selected from the group consisting of a thin film transistor, a field effect transistor, a MOS transistor, a bipolar transistor, an organic transistor, a memory element, a diode, a photoelectric conversion element, a resistor element, a coil, a capacitor element and an inductor.

* * * * *